United States Patent
Lee

(10) Patent No.: US 7,472,150 B2
(45) Date of Patent: Dec. 30, 2008

(54) METHOD AND SYSTEM FOR TIME SHARING N CONSECUTIVE HALF-BAND DECIMATING-BY-2-FILTERS USING A SINGLE FILTER

(75) Inventor: Sean (Yung-Hsiang) Lee, Aliseo Viejo, CA (US)

(73) Assignee: Broadcom Corporation, Irvine, CA (US)

(*) Notice: Subject to any disclaimer, the term of this patent is extended or adjusted under 35 U.S.C. 154(b) by 851 days.

(21) Appl. No.: 11/057,261

(22) Filed: Feb. 14, 2005

(65) Prior Publication Data
US 2006/0049969 A1    Mar. 9, 2006

Related U.S. Application Data

(60) Provisional application No. 60/608,801, filed on Sep. 9, 2004.

(51) Int. Cl.
*G06F 17/10* (2006.01)
(52) U.S. Cl. .................................................. 708/313
(58) Field of Classification Search ................. 708/313
See application file for complete search history.

(56) References Cited

U.S. PATENT DOCUMENTS

| | | | | |
|---|---|---|---|---|
| 5,157,395 A | * | 10/1992 | Del Signore et al. | 341/143 |
| 5,258,939 A | * | 11/1993 | Johnstone et al. | 708/313 |
| 5,590,065 A | * | 12/1996 | Lin | 708/313 |
| 5,642,382 A | * | 6/1997 | Juan | 375/232 |
| 6,018,754 A | * | 1/2000 | Chen et al. | 708/316 |
| 2004/0145502 A1 | * | 7/2004 | Thomson | 341/61 |

* cited by examiner

*Primary Examiner*—David H Malzahn
(74) *Attorney, Agent, or Firm*—McAndrews Held & Malloy, Ltd.

(57) ABSTRACT

A method and system for time sharing N consecutive half-band decimating-by-2-filters using a single filter. Aspects of the method may comprise selecting a latched input signal and filtering, via a single decimating filter, the selected latched input signal to generate a first output signal. The method may also comprise latching the fed back portion of the first output signal. This latched signal may also be filtered by the single decimating filter to generate at least a second decimated output signal. A final output signal may be generated by latching at least one of the first output signal and the second decimated output signal. The final output signal may be latched utilizing at least one of a plurality of clocking signals.

22 Claims, 6 Drawing Sheets

| State | Down-counter Bit Value | Multiplexer Input to Choose | Up-counter Bit Value |
|---|---|---|---|
| 500 | 111 | Sig_1 | 000 |
| 510 | 110 | Sig_2 | 001 |
| 520 | 101 | Sig_1 | 010 |
| 530 | 100 | Sig_3 | 011 |
| 540 | 011 | Sig_1 | 100 |
| 550 | 010 | Sig_2 | 101 |
| 560 | 001 | Sig_1 | 110 |
| 570 | 000 | D/C | 111 |

FIG. 5

METHOD AND SYSTEM FOR TIME SHARING N CONSECUTIVE HALF-BAND DECIMATING-BY-2-FILTERS USING A SINGLE FILTER

CROSS-REFERENCE TO RELATED APPLICATIONS/INCORPORATION BY REFERENCE

This application makes reference, claims priority to, and claims the benefit of U.S. Provisional Application Ser. No. 60/608801 filed Sep. 9, 2004.

The above stated application is hereby incorporated herein by reference in its entirety.

FIELD OF THE INVENTION

Certain embodiments of the invention relate to filtering of digital signals. More specifically, certain embodiments of the invention relate to a method and system for time sharing N consecutive half-band decimating-by-2-filters using a single filter.

BACKGROUND OF THE INVENTION

With the advent of digital signal processing (DSP), an increasing amount of radio frequency (RF) signal processing is done in the digital domain. An analog RF signal may be directly converted to a digital signal, or an analog IF signal may be converted to a digital IF signal, and subsequent DSP actions may convert the high frequency RF or IF digital signal to a lower frequency digital baseband. An analog-to-digital converter (ADC) may be used to sample an analog RF signal in order to convert the analog RF signal to a digitized signal. Downsampling or decimation may be utilized to reduce a frequency of the digitized signal to an appropriate baseband rate. In this regard, the number of samples per second in the digitized signal may be reduced by a factor N. Decimation filters may be utilized for downsampling, and a decimation filter that reduces the sampling frequency by a factor of N is referred to as a decimating-by-N filter. In addition to downsampling, a decimation filter may also be utilized to remove undesired out-of-band signals.

An advantage of having as much functionality as possible in the digital domain is that those functionalities may be implemented on a small number of chips, or even on a single chip. However, the more transistors there are on a chip, and the faster the switching speeds of the transistors, the greater the power consumption. This leads to a major problem of heat build-up on the chip, as well as concerns due to a direct cost of a larger chip size. The power consumed by the decimation filter is proportional to the frequency of the samples, and is inversely related to the width of the transition band. A transition band may comprise a band of frequencies between the pass band and the reject band. A pass band may comprise desired frequencies, and a reject band may comprise undesired frequencies that have been attenuated sufficiently that their effects on desired frequencies are negligible.

Generally, the higher the sampling rate and the narrower the transition bandwidth, the greater the power consumed by the filter. Decimation filters are, therefore, often used in stages in order to reduce the sample frequencies for the succeeding stages and because each filter only needs to proportionally reduce part of the aliasing signal. One result is a larger transition bandwidth for each filter. The slower sample frequency of the succeeding stages allow for lower power consumption by those filters, and the wider transition bandwidth also reduces power consumption. However, the additional stages of decimation filters require additional chip real estate, which leads to greater cost for the chip.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for time sharing N consecutive half-band decimating-by-2-filters using a single filter, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 5 is an exemplary state table illustrating generating output select signal, for example, for the multiplexer in FIG. 2a, in accordance with an embodiment of the invention.

DETAILED DESCRIPTION OF THE INVENTION

Certain embodiments of the invention may be found in a method and system for time sharing architecture for N consecutive half-band decimating-by-2-filters using a single filter. Various aspects of the invention may provide support for using a single decimating filter with feedback of filtered signals. A plurality of clock signals may be utilized by a plurality of data registers to store data that is to be filtered in these data registers. At least one of the plurality of clock signals may be utilized to store a desired output that may be generated by the decimating filter. Operation of the filter may not need to depend on the knowledge of the specific clock signal utilized to store the output from the decimating filter.

Figure 1:
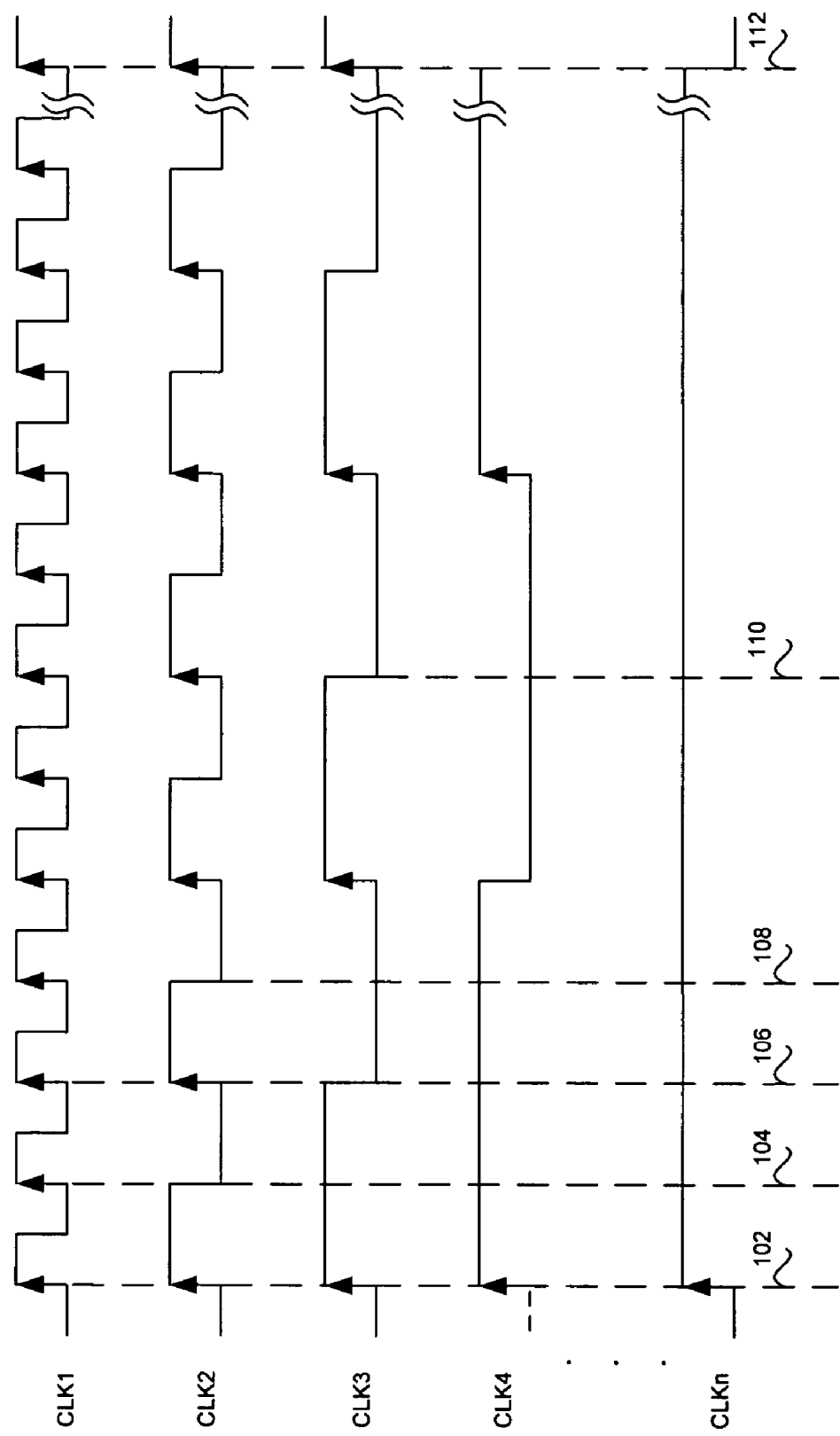
FIG. 1 is a timing diagram of exemplary clock signals that may be utilized in accordance with an embodiment of the invention.

FIG. 1 is a timing diagram of exemplary clock signals that may be utilized in accordance with an embodiment of the invention. Referring to FIG. 1, there is shown a plurality of clock signals, namely, clock signals CLK1, CLK2, CLK3, CLK4, . . . , CLKn. The fastest clock signal, CLK1, for example, may be utilized as a base clock signal and the other clock signals, for example, CLK2, CLK3, CLK4, . . . , CLKn may have periods which may be multiples of a period of the base clock signal CLK1. For example, in FIG. 1, CLK2 may have twice the period of CLK1, CLK3 may have four times the period of CLK1, and CLK4 may have eight times the period of CLK1. CLKn may have a period that may be $2^n$ times the period of CLK1. Although not shown, other clock signals may also be utilized. For example, a plurality of other clock signals may be utilized which may have periods between that of CLK4 and CLKn.

Additionally, the clock signals of FIG. 1 may be synchronous on rising edges. This may be viewed as a rising edge of a master clock signal, for example, CLK1, triggering a change in states of other clock signals, for example, CLK2, CLK3, CLK4, . . . , CLKn. A rising edge of the CLK1 102 may trigger a change in states of CLK2, CLK3, CLK4, . . . , CLKn to a high state. Similarly, a rising edge of CLK1 104 may trigger a change in state of CLK2 to a low state, a rising edge of CLK1 106 may trigger a change in state of CLK3 to a low state, a rising edge of CLK 110 may trigger a change in state of CLK4 to a low state, and rising edge of CLK1 114 may trigger a change in state of CLKn to a low state. Various embodiments of the invention may utilize other timing or clocking strategies. For example, a clock signal which may be faster than CLK1 may be utilized to generate the plurality of clock signals CLK1, CLK2, CLK3, CLK4, . . . , CLKn, and the states of these clock signals may be utilized to generate transitions from high state to low state, and vice versa, for each of the plurality of clock signals.

In the exemplary timing diagram of FIG. 1, although the clock signals may be synchronous on rising edges, the invention is not so limited. Accordingly, clock signals that are synchronous on falling edges may also be utilized. In addition, any discussion with respect to clock signals being synchronous with the rising edges may analogously apply to clock signals that are synchronous with the falling edges. Furthermore, for synchronous clock signals, the rising edges of the clock signals may be periodically coincidental 102, while the falling edges of the clock signals may not be coincidental. This may be exemplified by the falling edges of CLK2 104 and 108, by the falling edges of CLK3 106 and 110, by the falling edge of CLK4 112, and by the falling edge of CLKn 114. Therefore, the falling edges may be used to control timing and output of signals since the falling edge of a specific clock signal may not be coincident with the falling edge of any other clock signal.

Figure 2A:
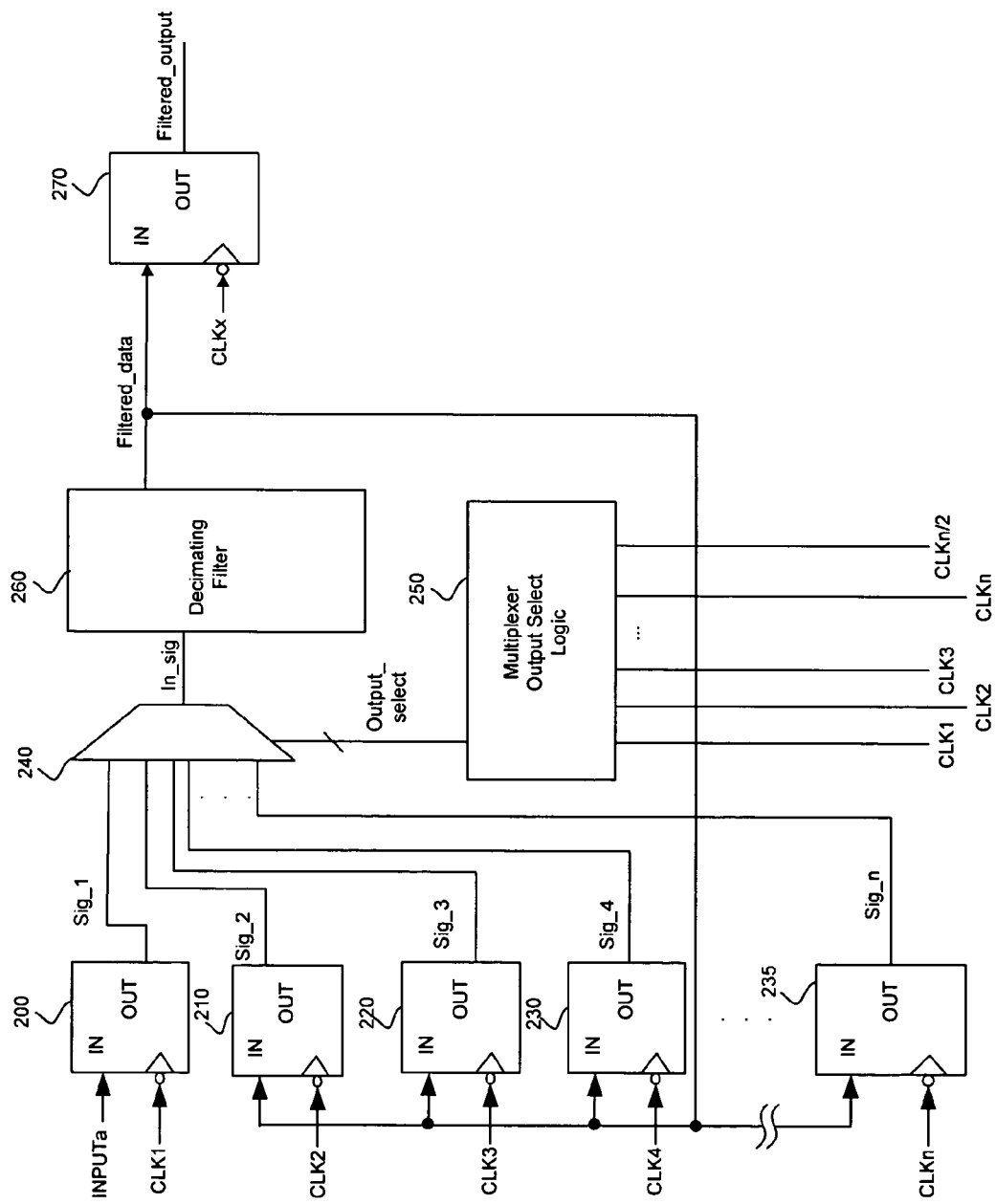
FIG. 2a is a block diagram illustrating exemplary filter of length one and N consecutive half-band decimating-by-2 filter stages, in accordance with an embodiment of the invention.

FIG. 2a is a block diagram illustrating exemplary filter of length one, in accordance with an embodiment of the invention. Referring to FIG. 2a, there is shown data registers (DRs) 200, 210, 220, 230, 235, and 270, a multiplexer 240 with a plurality of inputs, multiplexer output select logic 250, and a decimating filter 260. FIG. 2a further comprises a plurality of signals including INPUTa, CLK1, CLK2, CLK3, CLK4, CLKn, Output_select, Sig_1, Sig_2, Sig_3, Sig_4, Sig_n, In_sig, Filtered_data, Filtered_output and CLKx.

The clock signals CLK1, CLK2, CLK3, CLK4, and CLKn may correspond to the clock signals CLK1, CLK2, CLK3, CLK4, and CLKn, which are illustrated in FIG. 1. In an embodiment of the invention, the clock signal CLK1 may be a base clock signal and the clock signals CLK2, CLK3, CLK4, and CLKn may be clock signals that have periods that may be multiples of a period of the base clock signal CLK1.

The DRs 200, 210, 220, 230, 235 and 270 may comprise suitable logic and/or circuitry that may be adapted to receive data, which may be part of an input data signal, and to utilize a clock signal to store the data. The process of storing data at a particular instant of a signal will be referred to as latching. The stored data of the data register may be transferred to an output of the data register. The DR 200 may latch the signal INPUTa by utilizing the clock signal CLK1, and the output of DR 200 may be the output signal Sig_1. The DRs 210, 220, 230 and 235 may latch the filtered data signal Filtered_data, which may be generated by the decimating filter 260, by utilizing the clock signals CLK2, CLK3, CLK4 and CLKn, respectively, and the DRs 210, 220, 230 and 235 may output the signals Sig_2, Sig_3, Sig_4 and Sig_n, respectively.

The multiplexer 240 may comprise suitable logic, circuitry and/or code that may be utilized to select an input from a plurality of inputs as indicated by a select signal. For example, the multiplexer 240 may have as inputs the signals Sig_1, Sig_2, Sig_3, Sig_4, . . . , Sig_n. The multiplexer output select logic 250 may generate a select signal, for example, the output select signal Output_select, which may be communicated to the multiplexer 240, and the output signal generated by the multiplexer 240 may be the input signal to the decimating filter 260.

The multiplexer output select logic 250 may comprise suitable logic, circuitry and/or code that may be adapted to generate the output select signal Output_select, which may be a plurality of signals, to indicate to a multiplexer, for example, the multiplexer 240, to select an input that may be transferred to the output of the multiplexer 240. The decimating filter 260 may comprise suitable logic, circuitry and/or code that may be adapted to digitally filter a signal, for example, the signal In_sig to the decimator 260, and generate an output signal, for example, the filtered data signal Filtered_data. The decimating filter 260 may be a digital finite impulse response (FIR) filter, for example, that may be adapted to decimate samples by a factor of two. A decimate-by-2 filter may convert the sample rate of an input signal such that an output signal is converted to a sample rate that is one-half the sample rate of the input signal. The decimating filter 260 may also remove at least a portion of undesired components of the input signal, for example, an aliasing signal, by performing a digital equivalent of low pass filtering. An alternate embodiment of the invention may utilize an infinite impulse response (IIR) filter that decimates by two as the decimating filter 260.

The DR 270 may be adapted to latch the filtered data signal Filtered_data utilizing the signal CLKx, where CLKx may be any clock signal utilized in an exemplary embodiment of the invention that may have one-half the period of the clock utilized by the data register whose output was chosen by the multiplexer 240. For example, in FIG. 2a, the clock signal CLKx may be CLK2, CLK3, CLK4, CLKn, or a clock signal CLKn/2 that may have one-half the period of CLKn. The output signal Sig_1 generated by the DR 200, the output signal Sig_2 generated by the DR 210, the output signal Sig_3 generated by the DR 220, the output signal Sig_4 generated by the DR 230, and the output signal Sig_n generated by the DR 235 may be communicated to a plurality of inputs of the multiplexer 240. The output signal In_sig communicated by the multiplexer 240 may be communicated to the decimating filter 260. The output select signal Output_select of the multiplexer output select logic 250 may be communicated to the multiplexer 240 to indicate which input signal to the multiplexer 240 may be transferred to the output. The filtered data signal Filtered_data generated by the decimating filter 260 may be communicated to an input of the DR 270 and to inputs of the DRs 210, 220, 230 and 235.

In operation, the DR 200 may latch the signal INPUTa, and the output signal Sig_1 of the DR 200 may be communicated to one of the plurality of inputs of the multiplexer 240. The signal Output_select may indicate to the multiplexer 240 that the signal Sig_1 from DR 200 may be selected as output signal In_sig. The output signal In_sig of the multiplexer 240 may be communicated to the input of the decimating filter 260, and the resulting output of the decimating filter 260 may be the filtered data signal Filtered_data. The filtered data signal Filtered_data may be communicated to the DRs 210, 220, 230 and 235 where the falling edges of the clock signals CLK2, CLK3, CLK4, and CLKn, respectively, may be utilized to latch the filtered data signal Filtered_data.

The output select signal Output_select of the multiplexer output select logic 250 may indicate to the multiplexer 240 that the input signal Sig_2 from the DR 210 may be selected to be an output signal of the multiplexer 240. The output signal In_sig of the multiplexer 240 may be communicated to an input of the decimating filter 260. The DRs 210, 220, 230 and 235, may again latch the output of the decimating filter 260 utilizing the falling edges of the respective clock signals. This process may be repeated by selecting the output signal Sig_3 of the DR 220, the output signal Sig_4 of the DR 230 and then the output signal Sig_n of DR 235 as the output signal In_sig of the multiplexer 240. A clock signal CLKx may be utilized to latch the output filtered data signal (Filtered_data) of the decimating filter 260.

Figure 2B:
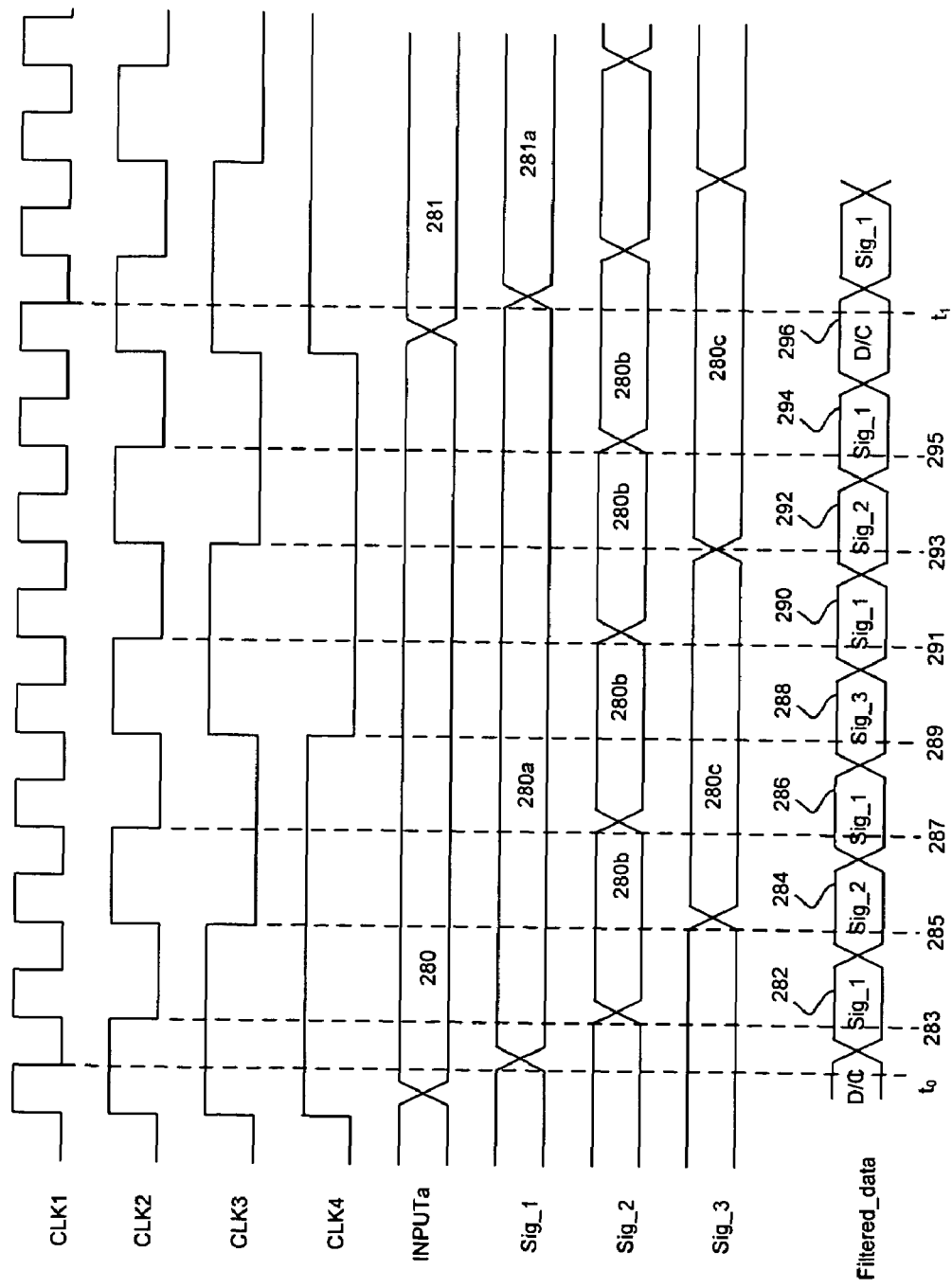
FIG. 2b is a timing diagram of exemplary data signals that may be latched by a plurality of clock signals, in accordance with an embodiment of the invention.

FIG. 2b is a timing diagram of exemplary data signals that may be latched by a plurality of clock signals, in accordance with an embodiment of the invention. Referring to FIG. 2b, there is shown clock signals CLK1, CLK2, CLK3, and CLK4, and data signals INPUTa, Sig_1, Sig_2, Sig_3, and Filtered_data. The clock signals CLK1, CLK2, CLK3, and CLK4 may be substantially similar to the clock signals CLK1, CLK2, CLK3, CLK4 in FIG. 1. The data signal INPUTa may be an input signal to the data register (DR) 200 (FIG. 2a) and Filtered_data may be the resulting output of the decimating filter 260 (FIG. 2a) in an embodiment of the invention. In an embodiment of the invention described in this figure, only the DRs 200, 210, 220 and 270 (FIG. 2a) may be utilized, and not the DRs 230, . . . , 235 (FIG. 2a). The multiplexer output select logic 250 (FIG. 2a) may be adapted to select one of the inputs Sig_1, Sig_2 or Sig_3 at appropriate times such that any falling edge of the clock signals CLK2, CLK3, or CLK4 may latch an appropriate decimated signal at the DR 270.

In operation, referring to FIG. 1a and FIG. 2b, the input signal INPUTa 280 may be latched by the DR 200 at every falling edge of the clock signal CLK1, starting at time $t_0$. The result may be an output signal Sig_1 280a that is a latched signal of the input signal INPUTa 280. Similarly, when the input signal INPUTa changes to a different value 281, the DR 200 output signal Sig_1 281a may be a latched signal of the input signal INPUTa 281, starting from the time $t_1$. The multiplexer output select logic 250 may generate an output signal Output_select that may allow the multiplexer 240 to select the output signal Sig_1 280a of the DR 200. This signal may be transferred to the output of the multiplexer 240, and may be communicated to the decimating filter 260. The output of the decimating filter may be the filtered signal Filtered_data 282. The filtered signal Filtered_data 282 may be latched by the DR 270 as the output signal Filtered_output at the falling edge of CLK2 283, for example, if the DR 270 utilizes CLK2. The filtered signal Filtered_data 282 may be the input signal INPUTa 280 decimated by two. The next falling edge after the falling edge of CLK2 283, among the clock signals CLK2, CLK3 and CLK4, may be the falling edge of the clock signal CLK3 285.

The filtered signal Filtered_data 282 may also be communicated to the DRs 210 and 220. The DR 210 may latch the filtered signal Filtered_data 282 on the falling edge of the clock signal CLK2 283, and the output of the DR 210 may be the signal Sig_2 280b. The multiplexer output select logic 250 may generate an output signal Output_select that may allow the multiplexer 240 to select the output signal Sig_2 280b of the DR 210. This signal may be transferred to the output of the multiplexer 240, and may be communicated to the decimating filter 260. The output of the decimating filter may be the filtered signal Filtered_data 284. The filtered signal Filtered_data 284 may be latched by the DR 270 as the output signal Filtered_output at the falling edge of CLK3 285, for example, if the DR 270 utilizes CLK3. The filtered signal Filtered_data 284 may be the input signal INPUTa 280 decimated by four. The next falling edge after the falling edge of CLK3 285, among the clock signals CLK2, CLK3 and CLK4, may be the falling edge of the clock signal CLK2 287.

The filtered signal Filtered_data 284 may also be communicated to the DRs 210 and 220. The DR 220 may latch the filtered signal Filtered_data 284 on the falling edge of the clock signal CLK3 285, and the output of the DR 220 may be the signal Sig_3 280c. Rather than choosing this signal, the multiplexer output select logic 250 may generate an output signal Output_select that may allow the multiplexer 240 to select the output signal Sig_1 280a of the DR 220. This may occur since the next falling edge of a clock signal may be the clock signal CLK2 287. The output signal Sig_1 280a may be transferred to the output of the multiplexer 240, and may be communicated to the decimating filter 260. The output of the decimating filter may be the filtered signal Filtered_data 286. The filtered signal Filtered_data 286 may be latched by the DR 270 as the output signal Filtered_output at the falling edge of CLK2 287, for example, if the DR 270 utilizes CLK2. The filtered signal Filtered_data 282 may be the input signal INPUTa 280 decimated by two. The next falling edge after the falling edge of CLK2 287, among the clock signals CLK2, CLK3 and CLK4, may be the falling edge of the clock signal CLK4 289.

The output of the DR 220, Sig_3 280c, which may have been latched on the falling edge of the clock signal CLK3 285, may be chosen as the output of the multiplexer 240. This may occur since the next falling edge of a clock signal may be the clock signal CLK3 289. The output signal Sig_3 280c may be transferred to the output of the multiplexer 240, and may be communicated to the decimating filter 260. The output of the decimating filter may be the filtered signal Filtered_data 288. The filtered signal Filtered_data 288 may be latched by the DR 270 as the output signal Filtered_output at the falling edge of CLK2 289, for example, if the DR 270 utilizes CLK3. The filtered signal Filtered_data 288 may be the input signal INPUTa 280 decimated by eight. The next falling edge after the falling edge of CLK3 289, among the clock signals CLK2, CLK3 and CLK4, may be the falling edge of the clock signal CLK2 291.

The multiplexer output select logic 250 may next generate the output signal Output_select that may allow the multiplexer 240 to select the output signal Sig_1 280a of the DR 200. This signal may be transferred to the output of the multiplexer 240, and may be communicated to the decimating filter 260. The output of the decimating filter may be the filtered signal Filtered_data 290. The filtered signal Filtered_data 290 may be latched by the DR 270 as the output signal Filtered_output at the falling edge of CLK2 291, for example, if the DR 270 utilizes CLK2. The filtered signal Filtered_data 290 may be the input signal INPUTa 280 decimated by two. The next falling edge after the falling edge of CLK2 291, among the clock signals CLK2, CLK3 and CLK4, may be the falling edge of the clock signal CLK3 293.

The filtered signal Filtered_data 290 may also be communicated to the DRs 210 and 220. The DR 210 may latch the filtered signal Filtered_data 290 on the falling edge of the clock signal CLK2 291, and the output of the DR 210 may be the signal Sig_2 280b. The multiplexer output select logic 250 may generate an output signal Output_select that may allow the multiplexer 240 to select the output signal Sig_2 280*b* of the DR 210. This signal may be transferred to the output of the multiplexer 240, and may be communicated to the decimating filter 260. The output of the decimating filter may be the filtered signal Filtered_data 292. The filtered signal Filtered_data 292 may be latched by the DR 270 as the output signal Filtered_output at the falling edge of CLK3 293, for example, if the DR 270 utilizes CLK3. The filtered signal Filtered_data 292 may be the input signal INPUTa 280 decimated by four. The next falling edge after the falling edge of CLK3 293, among the clock signals CLK2, CLK3 and CLK4, may be the falling edge of the clock signal CLK2 295.

The filtered signal Filtered_data 292 may also be communicated to the DRs 210 and 220. The DR 220 may latch the filtered signal Filtered_data 292 on the falling edge of the clock signal CLK3 293, and the output of the DR 220 may be the signal Sig_3 280*c*. Rather than choosing this signal, the multiplexer output select logic 250 may generate an output signal Output_select that may allow the multiplexer 240 to select the output signal Sig_1 280*a* of the DR 220. This may occur since the next falling edge of a clock signal may be the clock signal CLK2 295. The output signal Sig_1 280*a* may be transferred to the output of the multiplexer 240, and may be communicated to the decimating filter 260. The output of the decimating filter may be the filtered signal Filtered_data 294. The filtered signal Filtered_data 294 may be latched by the DR 270 as the output signal Filtered_output at the falling edge of CLK2 295, for example, if the DR 270 utilizes CLK2. The filtered signal Filtered_data 294 may be the input signal INPUTa 280 decimated by two.

Since there is no falling edge among the clock signals CLK2, CLK3 and CLK4, after the falling edge of CLK2 287, for the Filtered_data 296, the output of the multiplexer 240 may not matter. Therefore, the output signal Output_select of the multiplexer output select logic 250 may indicate any input of the multiplexer 240 to be transferred to the output. The cycle described above may repeat with each new input signal, for example, the input signal INPUTa 281 that may be latched by the DR 200.

Accordingly, as long as the multiplexer 240 outputs the correct signal at appropriate times, the clock signal CLKx utilized by the DR 270 may be any of CLK2, CLK3, or CLK4. Although this embodiment of the invention utilized DRs 200, 210 and 220, the invention need not be so limited. In this regard, different embodiments may utilize different numbers of data registers as design constraints may require. However, utilizing different numbers of data registers may require modification to the algorithm that selects the output of the multiplexer 240.

Figure 3:
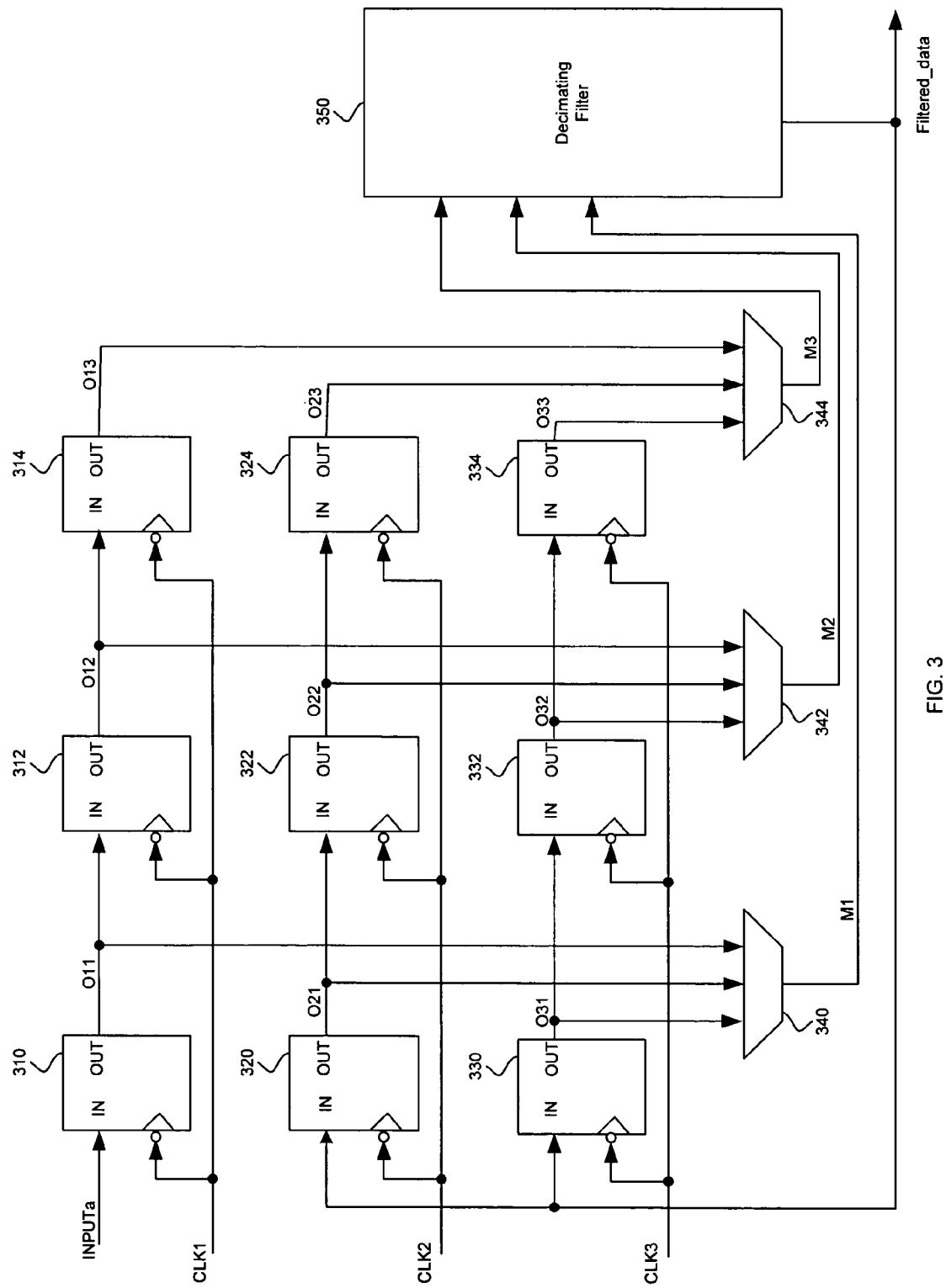
FIG. 3 is a block diagram illustrating exemplary filter of length three and three consecutive half-band decimating-by-2 filter stages, in accordance with an embodiment of the invention.

FIG. 3 is a block diagram illustrating exemplary filter of length three in accordance with an embodiment of the invention. Referring to FIG. 3, there is shown data registers (DR) 310, 312, 314, 320, 322, 324, 330, 332 and 334, multiplexers 340, 342 and 344, and a decimating filter 350.

The output of the DR 310 may be coupled to the DR 312 and to the multiplexer 340, the output of the DR 312 may be coupled to the DR 314 and to the multiplexer 342, and the output of the DR 314 may be coupled to the multiplexer 344. Similarly, the output of the DR 320 may be coupled to the DR 322 and to the multiplexer 340, the output of the DR 322 may be coupled to the DR 324 and to the multiplexer 342, and the output of the DR 324 may be coupled to the multiplexer 344. Additionally, the output of the DR 330 may be coupled to the DR 332 and to the multiplexer 340, the output of the DR 332 may be coupled to the DR 334 and to the multiplexer 342, and the output of the DR 334 may be coupled to the multiplexer 344. The outputs of the multiplexers 340, 342 and 344 may be coupled to the decimating filter 350. The output of the decimating filter 350 may be coupled to the DRs 320 and 330.

Output signal O11 of the DR 310 may be communicated to an input of the DR 312 and to an input of the multiplexer 340. The output signal O12 of the DR 312 may be communicated to an input of the DR 314 and to an input of the multiplexer 342. The output signal O13 of the DR 314 may be communicated to an input of the multiplexer 344. The output signal O21 of the DR 320 may be communicated to an input of the DR 322 and to an input of the multiplexer 340. The output signal O22 of the DR 322 may be communicated to an input of the DR 324 and to an input of the multiplexer 342. The output signal O23 may be communicated to a first input of a third multiplexer 344. The output signal O31 of the DR 330 may be communicated to an input of the DR 332 and to an input of the multiplexer 340. The output signal O32 of the DR 332 may be communicated to an input of the DR 334 and to an input of the multiplexer 342. The output signal O33 may be communicated to an input of the multiplexer 344.

An input signal to the multiplexer 340 may be transferred to an output of the multiplexer 340 as a signal M1, an input of the multiplexer 342 may be transferred to an output of the multiplexer 342 as a signal M2, and an input of the multiplexer 344 may be transferred to an output of the multiplexer 344 as a signal M3. The signals M1, M2 and M3 may be communicated to inputs of the decimating filter 350. The decimated output signal (Filtered_data) of the decimating filter 350 may be fed back as an input to the DRs 320 and 330. The decimated output signal (Filtered_data) may also be coupled to other circuitry, such as, for example, the DR 270 (FIG. 2*a*), such that the Filtered_data may be further digitally processed.

The DRs 310, 312 and 314 may utilize CLK1 to store data, the DRs 320, 322 and 324 may utilize CLK2 to store data, and the DRs 330, 332 and 334 may utilize CLK3 to store data. Inputs to the multiplexer 340 may be the outputs of DRs 310, 320 and 330. The multiplexer 342 may have as inputs the outputs of the DRs 312, 322 and 332. The inputs to the multiplexer 344 may be the outputs of the DRs 314, 324 and 334. Select logic substantially similar to the multiplexer output select logic 250 (FIG. 2*a*) may be utilized to generate select signals for the multiplexers 340, 342 and 344.

In operation, the DR 310 may latch the signal INPUTa, and the output signal O11 of the DR 310 may be communicated to one of the plurality of inputs of the multiplexer 340. The DR 312 may also latch the output signal O11 of the DR 310, and the output signal O12 of the DR 312 may be communicated to one of the plurality of inputs of the multiplexer 342. The DR 314 may also latch the output signal O12, and the output signal O13 of the DR 314 may be communicated to one of the plurality of inputs of the multiplexer 344. The multiplexer input signals O11, O12 and O13 may be selected as the outputs of the multiplexers 340, 342 and 344, respectively, and may be communicated to the decimating filter 360. The decimating filter 360 may output the signal Filtered_data as a result of the signals O11, O12 and O13.

The DR 320 may latch the output signal Filtered_data of the decimating filter, and the DR 322 may latch the output signal O21 of the DR 320. The DR 324 may latch the output signal O22 of the DR 322, and the DR 324 may have as an output the signal O23. The output signals O21, O22, and O23 may be communicated to the multiplexers 340, 342 and 344, respectively. These output signals may be selected as the outputs of the multiplexers 340, 342 and 344, respectively, and may be communicated to the decimating filter 360. The decimating filter 360 may output the signal Filtered_data as a result of the signals O21, O22 and O23.

The DR 330 may latch the new resulting output signal Filtered_data of the decimating filter 360, and the DR 332 may latch the output signal O31 of the DR 330. The DR 334 may latch the output signal O32 of the DR 332, and the DR 334 may have as an output the signal O33. The output signals O31, O32, and O33 of the DRs 330, 332 and 334, respectively, may be communicated to the multiplexers 340, 342 and 344, respectively. These output signals may be selected as the outputs of the multiplexers 340, 342 and 344, respectively, and may be communicated to the decimating filter 360. The output signal Filtered_data of the decimating filter 360 may be latched by an output register such as DR 270 (FIG. 2a). CLKx for the DR 270 may be CLK3 in this example.

Figure 4:
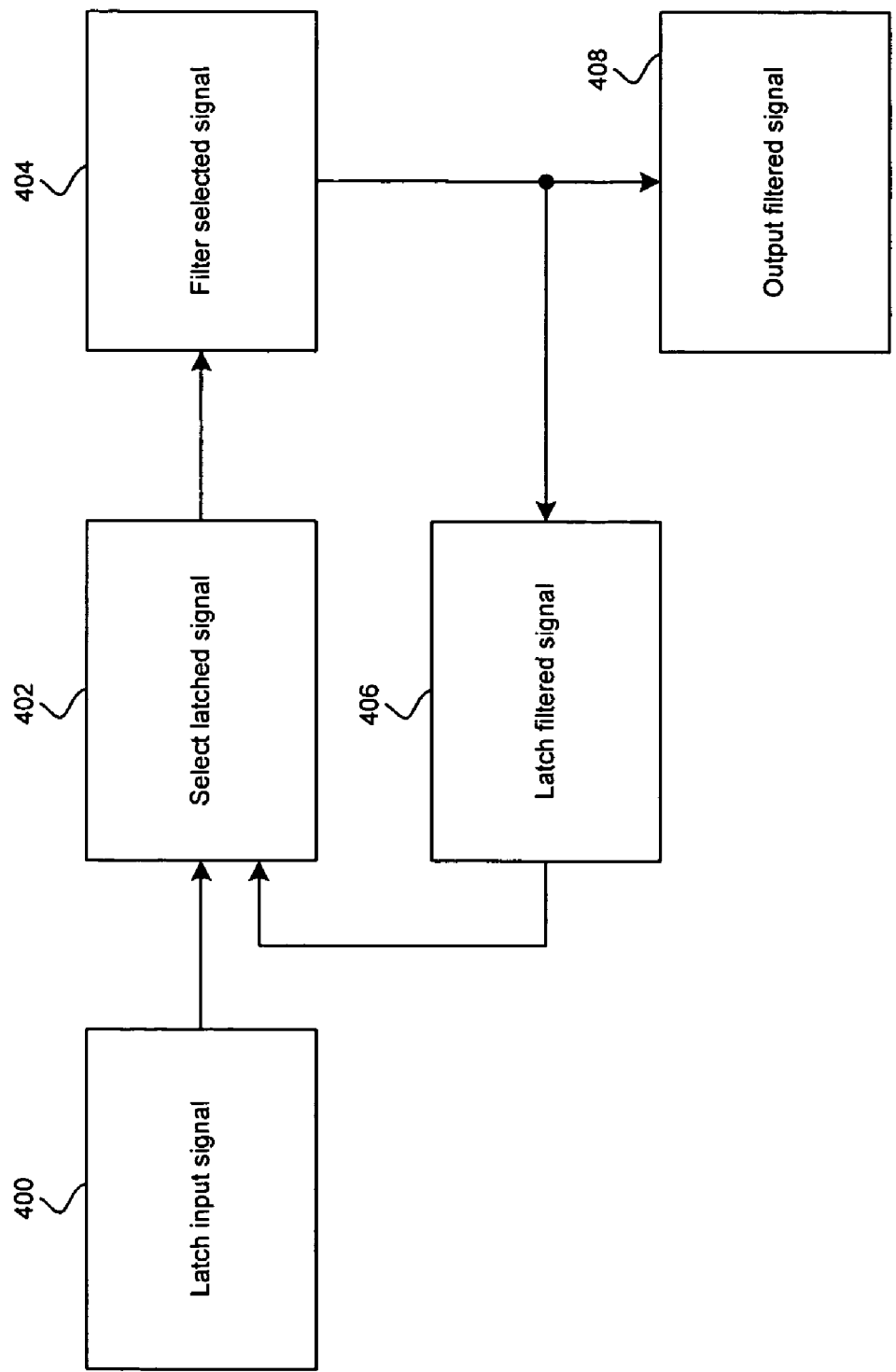
FIG. 4 is an exemplary flow diagram illustrating filtering signals, in accordance with an embodiment of the invention.

FIG. 4 is an exemplary flow diagram illustrating filtering signals in accordance with an embodiment of the invention. Referring to FIG. 4, in step 400, an input signal is latched by a data register (DR). In step 402, a multiplexer selects the latched signal. In step 404, the selected signal is decimated by filtering. In step 406, the filtered signal is fed back to be latched by a data register. In step 408, the filtered signal is latched by an output data register in order to be further processed.

Referring to FIGS. 2a and 4, the steps 400 to 408 may be utilized to decimate an input signal using a single digital filter. In step 400, an input signal, for example, INPUTa, may be latched. In step 402, the multiplexer 240 may select any of the outputs from the data register 200, which may latch an input signal INPUTa, or from the data registers 210, 220, 230, . . . , 235, which may latch the feedback signal Filtered_data, based on the functionality of the multiplexer output select logic 250. For example, the multiplexer output select logic 250 may be adapted to have data from the signal INPUTa decimated only once. In that event, the select logic 250 may indicate to the multiplexer 240 via the signal Output_select to always select Sig_1 from the data register 200.

If the multiplexer output select logic 250 is adapted to have data from the signal INPUTa decimated twice, then it may indicate to the multiplexer 240 to select Sig_1 from the data register 200 and then select the output from the data register 210 at appropriate times. The selection of signals from the data registers 200 and 210 will be repeated. Similarly, if data from the signal INPUTa is to be decimated three times, the multiplexer output select logic 250 will select the signal Sig_1, and then the signal Sig_2, and then the signal Sig_3 at appropriate times. In this manner, the multiplexer output select logic 250 may be adapted to allow any number of iterations of decimation feasible in the embodiment of the invention. The embodiment of the invention may allow the use of a plurality of clock signals to latch the output data via the data register 270. In this regard, the multiplexer output select logic 250 may be adapted to have the multiplexer 240 select appropriate inputs to the multiplexer 240, as described in FIG. 2b.

In step 404, the output of the multiplexer 240 may be the signal In_sig, which may be filtered by the decimating filter 260. In step 406, the filtered signal, which may be the signal Filtered_data, may be fed back to data registers 210, 220, 230 and 235 where the signal Filtered_data may be latched for further decimation. In step 408, the data register 270 may also latch the filtered data signal (Filtered_data) in order to generate the filtered output signal (Filtered_output).

FIG. 5 is an exemplary state table illustrating generating output select signal, for example, for the multiplexer in FIG. 2a, in accordance with an embodiment of the invention. An embodiment of the invention that utilizes falling edges of clock signals to latch data may use a down-counter in a state table, and an embodiment of the invention that utilizes rising edges of clock signals to latch data may use an up-counter in a state table. The number of bits in the counter may be the number of feedback registers in the exemplary embodiment plus one. For example, the exemplary embodiment of the invention described in FIG. 2b utilized two data registers 210 and 220 (FIG. 2a) as feedback registers. Therefore, the total number of bits in the counter is three. The three bits in the counter may be the clock signals, for example, CLK2 and CLK3, that are utilized by the data registers 210 and 220 (FIG. 2a) plus a third clock signal, for example, CLK4, that is one-half the rate of the slowest clock used by the feedback registers. The slowest clock signal, for example, CLK4, may be the most significant bit and the fastest clock signal, for example, CLK2 may be the least significant bit.

Referring to FIGS. 2a, 2b and 5, at state 500, the down-counter may have a bit value of "111" and the falling edge of the CLK1 may latch the input signal INPUTa 280 to generate the signal Sig_1 280a. Since a down-counter is used, the down-counter bit value at the next state may be "110." The transition from a "1" to a "0" by the least significant bit may indicate that the data register 270 may utilize CLK2 to latch the output Filtered_data of the decimating filter 260 if, for example, CLKx (FIG. 2a) is CLK2. Therefore, Sig_1 may be selected to be transferred to the output of the multiplexer 240.

At state 510, the down-counter may have a bit value of "110" and the down-counter bit value at the next state may be "101." The transition from a "1" to a "0" by the second bit may indicate that the data register 270 may utilize CLK3 to latch the output Filtered_data of the decimating filter 260 if, for example, CLKx is CLK3. Therefore, Sig_2 may be selected to be transferred to the output of the multiplexer 240.

At state 520, the down-counter may have a bit value of "101" and the down-counter bit value at the next state may be "100." The transition from a "1" to a "0" by the least significant bit may indicate that the data register 270 may utilize CLK2 to latch the output Filtered_data of the decimating filter 260 if, for example, CLKx is CLK2. Therefore, Sig_1 may be selected to be transferred to the output of the multiplexer 240.

At state 530, the down-counter may have a bit value of "100" and the down-counter bit value at the next state may be "011." The transition from a "1" to a "0" by the most significant bit may indicate that the data register 270 may utilize CLK4 to latch the output Filtered_data of the decimating filter 260 if, for example, CLKx is CLK4. Therefore, Sig_3 may be selected to be transferred to the output of the multiplexer 240.

States 540 to 560 repeat the steps of states 500 to 520 since the least significant two bits change in the same sequence. At state 570, however, all bits are zeros, and the bit value at the next state may be "111." Since no bits change from a "0" to a "1," there will not be a falling edge of any of the clock signals CLK2, CLK3 or CLK4 to latch the data register 270. Therefore, this may be a don't care state where the output of the multiplexer 240 may not matter.

Similarly, if rising edges of clock signals are utilized, then an up-counter may be used. The exemplary values of an up-counter is shown in the last column of the state table in FIG. 5. Although a counter was used in the description of an embodiment of the invention, the invention need not be limited in this manner. Other schemes, including other state values and ROM look-up tables, may be utilized to generate the output select signal for the multiplexer.

Accordingly, the present invention may be realized in hardware, software, or a combination of hardware and software.

The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for decimation filtering, the method comprising:
    selecting an input signal that is latched;
    filtering, via a single decimating filter, said selected latched input signal to generate a first output signal;
    feeding back at least a portion of said first output signal;
    generating at least a second decimated output signal from said fed back at least said portion of said first output signal via said single decimating filter; and
    generating a final output signal by latching at least one of said first output signal and said at least said second decimated output signal utilizing at least one of a plurality of clocking signals.

2. The method according to claim 1, comprising latching at least a portion of said fed back at least said portion of said first output signal utilizing at least one of said plurality of clocking signals.

3. The method according to claim 2, comprising selecting said latched at least said portion of said fed back at least said portion of said first output signal.

4. The method according to claim 3, comprising selecting one of said latched input signal and said latched at least said portion of said fed back at least said portion of said first output signal, wherein said final output signal is latched by any one of said plurality of clocking signals.

5. The method according to claim 3, comprising filtering, via said single decimating filter, said selected latched at least said portion of said fed back at least said portion of said first output signal.

6. The method according to claim 5, comprising generating said at least said second decimated output signal from said filtered selected latched at least said portion of said fed back at least said portion of said first output signal.

7. The method according to claim 1, comprising generating said latched input signal utilizing a base clocking signal to latch said input signal.

8. The method according to claim 7, wherein a period of each of said plurality of clocking signals is an even multiple of a period of said base clocking signal.

9. The method according to claim 7, wherein each of said plurality of clocking signals has a unique frequency that is different from a frequency of said base clocking signal.

10. The method according to claim 7, comprising latching signals by utilizing falling edges of said base clocking signal and each of said plurality of clocking signals if each of said plurality of clocking signals is synchronized with rising edges of said base clocking signal.

11. The method according to claim 7, comprising latching signals by utilizing rising edges of said base clocking signal and each of said plurality of clocking signals if each of said plurality of clocking signals is synchronized with falling edges of said base clocking signal.

12. A system for decimation filtering, the system comprising:
    at least one multiplexer that selects an input signal that is latched;
    a single decimating filter that filters said selected latched input signal to generate a first output signal;
    circuitry that feeds back at least a portion of said first output signal;
    circuitry that generates at least a second decimated output signal from said fed back at least said portion of said first output signal via said single decimating filter; and
    circuitry that generates a final output signal by latching at least one of said first output signal and said at least said second decimated output signal utilizing at least one of a plurality of clocking signals.

13. The system according to claim 12, comprising at least one data register that latches at least a portion of said fed back at least said portion of said first output signal utilizing at least one of said plurality of clocking signals.

14. The system according to claim 13, wherein said at least one multiplexer selects said latched at least said portion of said fed back at least said portion of said first output signal.

15. The system according to claim 14, wherein said single decimating filter filters said selected latched at least said portion of said fed back at least said portion of said first output signal.

16. The system according to claim 14, comprising circuitry that indicates to said at least one multiplexer to select one of said latched input signal and said latched at least said portion of said fed back at least said portion of said first output signal, wherein said final output signal is latched by any one of said plurality of clocking signals.

17. The system according to claim 15, wherein said circuitry that generates said at least said second decimated output signal has as an input said filtered selected latched at least said portion of said fed back at least said portion of said first output signal.

18. The system according to claim 12, comprising circuitry that generates said latched input signal utilizing a base clocking signal to latch said input signal.

19. The system according to claim 18, wherein a period of each of said plurality of clocking signals is an even multiple of a period of said base clocking signal.

20. The system according to claim 18, wherein each of said plurality of clocking signals has a unique frequency that is different from a frequency of said base clocking signal.

21. The system according to claim 18, comprising circuitry that latches signals by utilizing falling edges of said base clocking signal and each of said plurality of clocking signals if each of said plurality of clocking signals is synchronized with rising edges of said base clocking signal.

22. The system according to claim 18, comprising circuitry that latches signals by utilizing rising edges of said base clocking signal and each of said plurality of clocking signals if each of said plurality of clocking signals is synchronized with falling edges of said base clocking signal.

* * * * *